(12) United States Patent
Jarcy et al.

(10) Patent No.: US 6,787,895 B1
(45) Date of Patent: Sep. 7, 2004

(54) LEADLESS CHIP CARRIER FOR REDUCED THERMAL RESISTANCE

(75) Inventors: Michael J. Jarcy, Tustin, CA (US); Andrew R. Gizara, Lake Forest, CA (US); Evans S. McCarthy, Costa Mesa, CA (US); Robbie U. Villanueva, Il Via Bandada, CA (US); Hassan S. Hashemi, Laguna Niguel, CA (US); Mahyar S. Dadkhah, Harvard, MA (US)

(73) Assignee: Skyworks Solutions, Inc., Irvine, CA (US)

( * ) Notice: Subject to any disclaimer, the term of this patent is extended or adjusted under 35 U.S.C. 154(b) by 0 days.

(21) Appl. No.: 10/013,130

(22) Filed: Dec. 7, 2001

(51) Int. Cl.[7] .............................................. H01L 23/34
(52) U.S. Cl. .................. 257/698; 257/713; 257/723; 257/782; 257/784; 174/252; 174/260; 174/262; 361/719; 361/764; 361/783; 438/122; 438/125
(58) Field of Search ................................. 361/719, 720, 361/761, 762, 764, 767, 768, 771, 783; 257/707, 713, 720, 723, 782, 784, 700–703, 698; 174/260, 252, 262; 438/122, 125

(56) References Cited

U.S. PATENT DOCUMENTS

| 3,777,221 A | * | 12/1973 | Tatusko et al. | 361/761 |
|---|---|---|---|---|
| 5,541,450 A | * | 7/1996 | Jones et al. | 257/697 |
| 5,543,661 A | * | 8/1996 | Sumida | 257/707 |
| 5,642,261 A | * | 6/1997 | Bond et al. | 361/704 |
| 5,663,869 A | * | 9/1997 | Vinciarelli et al. | 361/707 |
| 5,991,156 A | * | 11/1999 | Bond et al. | 361/707 |
| 6,133,634 A | * | 10/2000 | Joshi | 257/738 |
| 6,455,926 B2 | * | 9/2002 | Ho | 257/678 |

\* cited by examiner

Primary Examiner—John B. Vigushin
(74) Attorney, Agent, or Firm—Farjami & Farjami LLP (57) ABSTRACT

According to one embodiment, a semiconductor die is situated in a cutout section of a substrate. In one embodiment, the substrate is situated on a printed circuit board such that the semiconductor die situated in the cutout section of the substrate is also situated on a support pad on the top surface of the printed circuit board. In one embodiment, a semiconductor die bond pad on the semiconductor die is connected to a substrate bond pad on the substrate. In one embodiment, an interconnect trace on the substrate is connected to an interconnect pad on the top surface of the printed circuit board.

27 Claims, 4 Drawing Sheets

LEADLESS CHIP CARRIER FOR REDUCED THERMAL RESISTANCE

BACKGROUND OF THE INVENTION

1. Field of the Invention

The present invention is generally in the field of semiconductor circuits. More specifically, the present invention is in the field of semiconductor die packaging.

2. Background Art

As businesses and individuals have become increasingly reliant on the information and communication provided via the Internet, the demand for greater bandwidth provided by high-speed broadband Internet services, such as DSL ("Digital Subscriber Line") and cable modem services, has increased dramatically. In order to meet this demand and remain competitive, service providers of DSL services require DSL central site modems ("CSM") with very high port density. Although high port density has been a market requirement for conventional digital CSMs for a number of years, the types of integrated circuits ("ICs") used in DSL CSMs have presented a problem in increasing port density in those devices.

Is Conventional digital CSMs, such as digital V.90 CSMs, contain digital circuits that can be integrated to provide high port densities. DSL CSMs also include digital circuits that allow similar integration. However, in contrast to conventional digital CSMs, DSL CSMs also contain analog circuits, such as analog front ends ("AFE") and line drivers, that do not allow the same type of integration as digital circuits. For example, the AFE and line driver ICs in DSL CSMs are required to dissipate heat generated from approximately one watt of power during operation. In order to dissipate the heat generated by the approximate one watt of power, the current approach is to provide special packaging for the DSL CSM die containing the line driver and AFE circuitry which does not lend itself to compact integration with high port densities.

For example, in order to dissipate the heat generated by the line driver and AFE circuitry of a DSL CSM, a single die containing the line driver and AFE circuitry is put into an Extended Thin Quad Flat Pack ("ETQFP") package. The ETQFP package includes a metal slug with the die glued to the top surface of the metal slug using conductive thermal adhesive. The bottom surface of the metal slug is then soldered to a host printed circuit board ("PCB") to allow, for example, a ground plane in the host PCB to distribute and dissipate the heat generated by the die throughout the host PCB. The metal slug in the ETQFP package and the ground plane in the host PCB are typically made of a good thermal conducting metal such as copper to facilitate the heat transfer from the die to the host PCB by reducing thermal resistance. Additionally, the host PCB can include vias located under the bottom surface of the metal slug in the ETQFP package to further facilitate the heat transfer from the die to the host PCB.

The ETQFP package approach discussed above is somewhat effective in dissipating heat generated by the line driver and AFE circuitry of a DSL CSM. However, the resulting ETQFP package is large in size and, further, does not allow for multiple dies to be placed in a single ETQFP package. Thus, because of the resulting large size of the ETQFP package, the ETQFP package approach currently used limits port density in a DSL CSM.

Therefore, there exists a need for a novel and reliable structure and method to support, house, and electrically connect multiple semiconductor dies to a PCB to overcome the problems faced by conventional semiconductor die packages. More specifically, there exists a need for a novel and reliable structure and method to support, house, and electrically connect multiple semiconductor dies to a PCB while providing sufficient heat dissipation and reduced thermal resistance to enable port density to be increased in a DSL CSM.

SUMMARY OF THE INVENTION

The present invention is directed to a leadless chip carrier for reduced thermal resistance. The invention discloses method and structure to support, house, and electrically connect one or more semiconductor dies to a printed circuit board while providing sufficient heat dissipation and reduced thermal resistance. According to one embodiment, a semiconductor die is situated in a cutout section of a substrate. The substrate can comprise, for example, a ceramic material or a fiber glass based laminate material, such as FR4. The semiconductor die can be attached to the substrate, for example, by epoxy. In one embodiment, the substrate is situated on a printed circuit board such that the semiconductor die situated in the cutout section of the substrate is situated on a support pad on the top surface of the printed circuit board. In one embodiment, a semiconductor die bond pad on the semiconductor die is connected to a substrate bond pad on the substrate. In one embodiment, an interconnect trace on the substrate is connected to an interconnect pad on the top surface of the printed circuit board.

Due to reduced thermal resistance between the semiconductor die and the support pad on the printed circuit board, the present invention provides a superior means for efficiently dissipating heat generated by the semiconductor die. Moreover, the present invention's efficient heat dissipation is further achieved in a multiple semiconductor die structure, wherein each semiconductor die is situated in a cutout section of the substrate over a respective support pad on the printed circuit board.

DETAILED DESCRIPTION OF THE INVENTION

The present invention is directed to a leadless chip carrier for reduced thermal resistance. The following description contains specific information pertaining to various embodiments and implementations of the invention. One skilled in the art will recognize that the present invention may be practiced in a manner different from that specifically discussed in the present application. Moreover, some of the specific details of the invention are not discussed in order not to obscure the invention. The specific details not described in the present application are within the knowledge of a person of ordinary skills in the art.

The drawings in the present application and their accompanying detailed description are directed to merely example embodiments of the invention. To maintain brevity, other embodiments of the invention that use the principles of the present invention are not specifically described in the present application and are not specifically illustrated by the present drawings.

Figure 1:
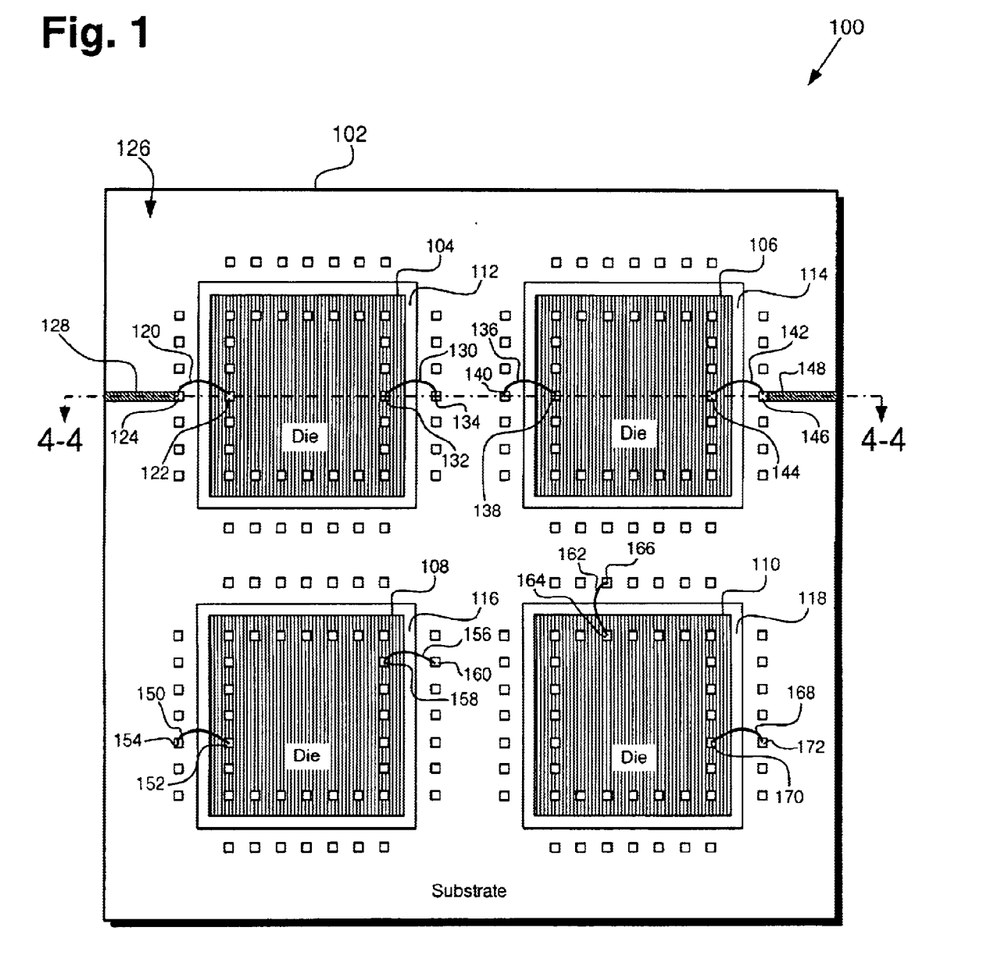
FIG. 1 illustrates a top view of an exemplary structure in accordance with one embodiment of the present invention.

Structure 100 in FIG. 1 illustrates a top view of an exemplary structure in accordance with one embodiment of the present invention. Structure 100 includes substrate 102, which provides support for semiconductor dies 104, 106, 108, and 110. It is noted that a "semiconductor die," such as semiconductor die 104, is also referred to as a "die," a "chip," or a "semiconductor chip" in the present application. Substrate 102 can comprise an organic material such as polytetrafluoroethylene material or a fiber glass based laminate material, such as FR4. In one embodiment, substrate 102 can comprise a ceramic material. Structure 100 also includes cutout sections 112, 114, 116, and 118, which can be formed by cutting four appropriately sized holes in substrate 102. Semiconductor dies 104, 106, 108, and 110, respectively, are inserted and centered in cutout sections 112, 114, 116, and 118 in substrate 102 in a manner that will be discussed in more detail in a later section of the present application.

As shown in FIG. 1, a first end of bonding wire 120 is bonded to semiconductor die 104 bond pad 122, and a second end of bonding wire 120 is bonded to substrate bond pad 124. Thus, bonding wire 120 electrically connects semiconductor die 104 bond pad 122 to substrate bond pad 124. Substrate bond pad 124 is fabricated on top surface 126 of substrate 102. A mask can be used to pattern conductors on a copper metallization layer on top surface 126 of substrate 102. The excess copper can be etched away, resulting in a defined metal pattern that can include, for example, substrate bond pad 124. Substrate bond pad 124 can comprise nickel-plated copper. Substrate bond pad 124 can also further comprise a layer of gold plating over the nickel-plated copper to provide a surface for wire bonding. Bonding wire 120 can comprise gold or can comprise other metals such as aluminum. The diameter of bonding wire 120 can be 30.0 microns or other diameter of choice.

Also shown in FIG. 1, interconnect trace 128 is connected to substrate bond pad 124 to provide an electrical connection between substrate bond pad 124 and a printed circuit board ("PCB") (not shown in FIG. 1). Similar to substrate bond pad 124, interconnect trace 128 is fabricated on top surface 126 of substrate 102. In structure 100, interconnect trace 128 can comprise copper; however, interconnect trace 128 can comprise other metals, such as aluminum or gold.

As further shown in FIG. 1, a first end of bonding wire 130 is bonded to semiconductor die 104 bond pad 132, and a second end of bonding wire 130 is bonded to substrate bond pad 134. Thus, bonding wire 130 electrically connects semiconductor die 104 bond pad 132 with substrate bond pad 134. Similar to substrate bond pad 124, substrate bond pad 134 is fabricated on top surface 126 of substrate 102, and comprises the same material as substrate bond pad 124. Bonding wire 130 is similar to bonding wire 120 described above.

Also shown in FIG. 1, a first end of bonding wire 136 is bonded to semiconductor die 106 bond pad 138, and a second end of bonding wire 136 is bonded to substrate bond pad 140. A first end of bonding wire 142 is bonded to semiconductor die 106 bond pad 144, and a second end of bonding wire 142 is bonded to substrate bond pad 146. Substrate bond pads 140 and 146 are similar to substrate bond pad 124, and comprise the same material as substrate bond pad 124. Also, bonding wires 136 and 142 are similar to bonding wire 120. Further shown in FIG. 1, interconnect trace 148 is connected to substrate bond pad 146 to provide an electrical connection between substrate bond pad 146 and a PCB (not shown in FIG. 1). Similar to substrate bond pad 124, interconnect trace 148 is fabricated on top surface 126 of substrate 102. Interconnect trace 148 can comprise copper; however, interconnect trace 148 can comprise other metals, such as aluminum or gold.

Also shown in FIG. 1, a first end of bonding wire 150 is bonded to semiconductor die 108 bond pad 152, and a second end of bonding wire 150 is bonded to substrate bond pad 154. A first end of bonding wire 156 is bonded to semiconductor die 108 bond pad 158, and a second end of bonding wire 156 is bonded to substrate bond pad 160. Substrate bond pads 154 and 160 are similar to substrate bond pad 124 discussed above, and comprise the same material as substrate bond pad 124. Also, bonding wires 150 and 156 are similar to bonding wire 120 discussed above.

Further shown in FIG. 1, a first end of bonding wire 162 is bonded to semiconductor die 110 bond pad 164, and a second end of bonding wire 162 is bonded to substrate bond pad 166. A first end of bonding wire 168 is bonded to semiconductor die 110 bond pad 170, and a second end of bonding wire 168 is bonded to substrate bond pad 172. Substrate bond pads 166 and 172 are similar to substrate bond pad 124 discussed above, and comprise the same material as substrate bond pad 124. Also, bonding wires 162 and 168 are similar to bonding wire 120 discussed above. It is noted that in FIG. 1, only substrate bond pads 124, 134, 140, 146, 154, 160, 166, and 172, semiconductor die 104 bond pads 122 and 132, semiconductor die 106 bond pads 138 and 144, semiconductor die 108 bond pads 152 and 158, and semiconductor 110 bond pads 164 and 170 are specifically discussed herein to preserve brevity.

Figure 2:
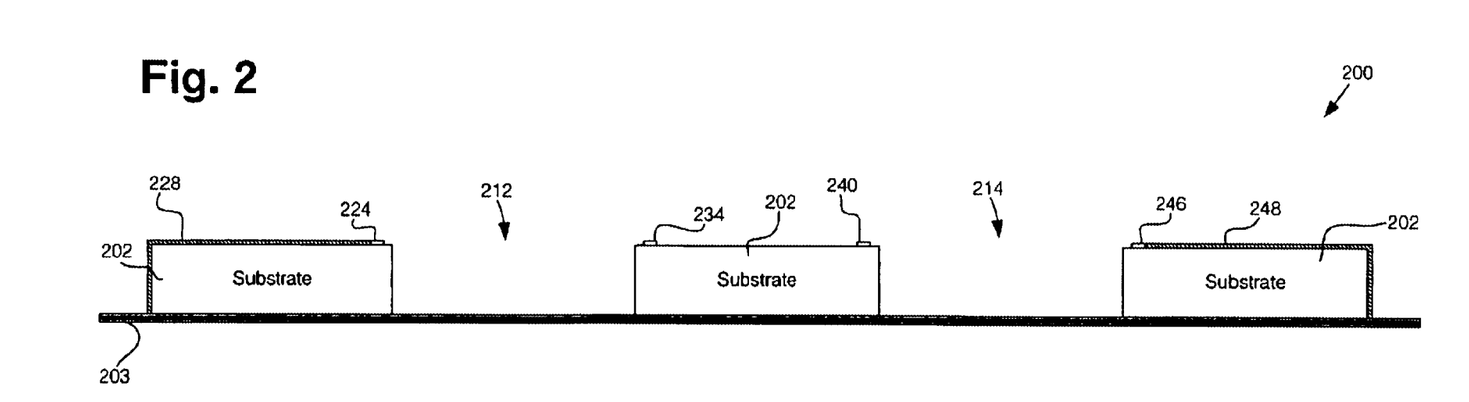
FIG. 2 illustrates a cross-sectional view of a substrate with two cutout sections situated on tape according to an embodiment of the present invention.

One embodiment of the invention's method and structure to fabricate a leadless chip carrier is shown in FIGS. 2 through 7, which illustrate various steps in the present invention by showing the cross sections of the resulting structures after each step. As the first step of the present embodiment of the invention, structure 200 in FIG. 2 shows substrate 202, which corresponds to substrate 102 in FIG. 1. Substrate 202 includes substrate bond pads 224, 234, 240, and 246, interconnect traces 228 and 248, and cutout sections 212 and 214, respectively, which correspond to substrate bond pads 124, 134, 140, and 146, traces 128 and 148, and cutout sections 112 and 114 in FIG. 1.

As shown in FIG. 2, substrate 202 is situated on tape 203. Tape 203 provides an adhesive surface on which to hold substrate 202 in alignment during fabrication of the invention's leadless chip carrier. In the present embodiment, tape 203 can comprise a low-static heat-resistant adhesive that doesn't stretch or bend, such as Kapton tape. Substrate 202 can comprise organic material such as polytetrafluoroethylene material or a fiber glass based laminate material, such as FR4. In one embodiment, substrate 202 can comprise a ceramic material. Further shown in FIG. 2, cutout sections 212 and 214 extend completely through substrate 202. Cutout sections 212 and 214 can be formed by cutting two appropriately sized holes in substrate 202.

Figure 3:
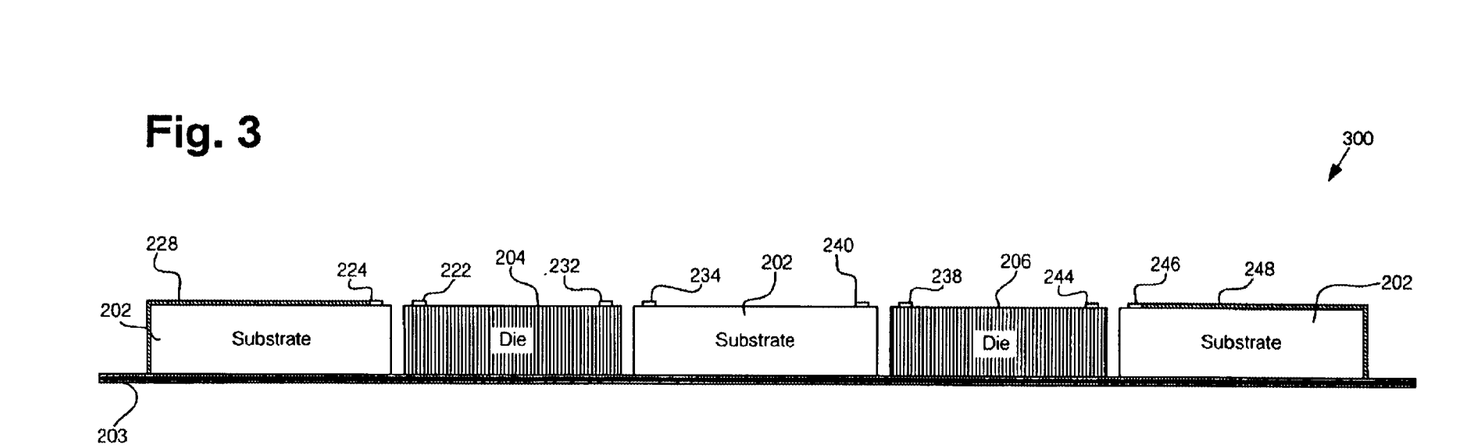
FIG. 3 illustrates the substrate in FIG. 2 with two semiconductor dies situated in two cutout sections of the substrate.

FIG. 3 shows the next step in the present embodiment of the invention. As shown in FIG. 3, semiconductor die 204 is inserted in cutout section 212 such that the bottom surface of semiconductor die 204 is secured to tape 203. Similarly, semiconductor die 206 is inserted in cutout section 214 such that the bottom surface of semiconductor die 206 is secured to tape 203. Thus, semiconductor dies 204 and 206 are held in alignment with substrate 202 by tape 203. Semiconductor dies 204 and 206, respectively, correspond to semiconductor dies 104 and 106 in FIG. 1.

As shown in FIG. 3, semiconductor die 204 includes semiconductor die 204 bond pads 222 and 232, respectively, which correspond to semiconductor die 104 bond pads 122 and 132 in FIG. 1. Also, semiconductor die 206 includes semiconductor die 206 bond pads 238 and 244, respectively, which correspond to semiconductor die 106 bond pads 138 and 144 in FIG. 1. As a result of the present embodiment's step shown in FIG. 3, semiconductor dies 204 and 206 have been added to structure 200 in FIG. 2.

Figure 4:
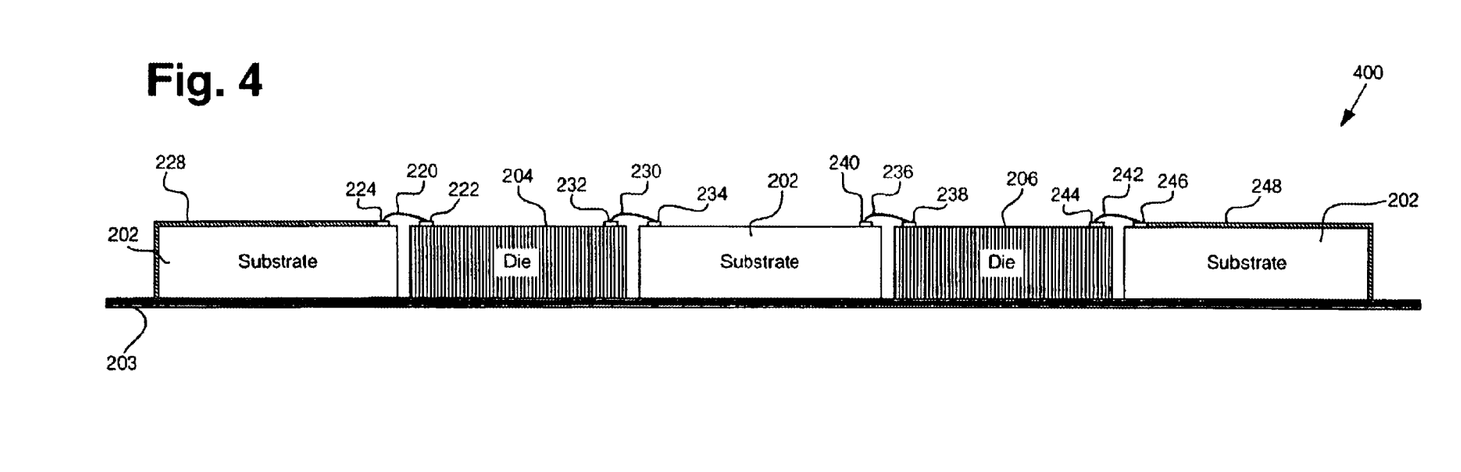
FIG. 4 illustrates bonding wires connecting the two semiconductor dies with the substrate in FIG. 3.

The next step according to the present embodiment of the invention is shown in FIG. 4. Structure 400 in FIG. 4 illustrates a cross-sectional view of structure 100 along line 4—4 in FIG. 1. As shown in FIG. 4, first ends of bonding wires 220 and 230, respectively, are bonded to semiconductor die 204 bond pads 222 and 232, and second ends of bonding wires 220 and 230, respectively, are bonded to substrate bond pads 224 and 234. Bonding wires 220 and 230, respectively, correspond to bonding wires 120 and 130 in FIG. 1.

Also shown in FIG. 4, first ends of bonding wires 236 and 242, respectively, are bonded to semiconductor die 206 bond pads 238 and 244, and second ends of bonding wires 236 and 242, respectively, are bonded to substrate bond pads 240 and 246. Bonding wires 236 and 242, respectively, correspond to bonding wires 136 and 142 in FIG. 1. Thus, as a result of the present embodiment's step shown in FIG. 4, bonding wires 220, 230, 236, and 242 have been added to structure 300 in FIG. 3. Bonding wires 220 and 230 electrically connect semiconductor die 204 to interconnect traces and/or vias in substrate 202, and bonding wires 236 and 242 electrically connect semiconductor die 206 to interconnect traces and/or vias in substrate 202.

Figure 5:
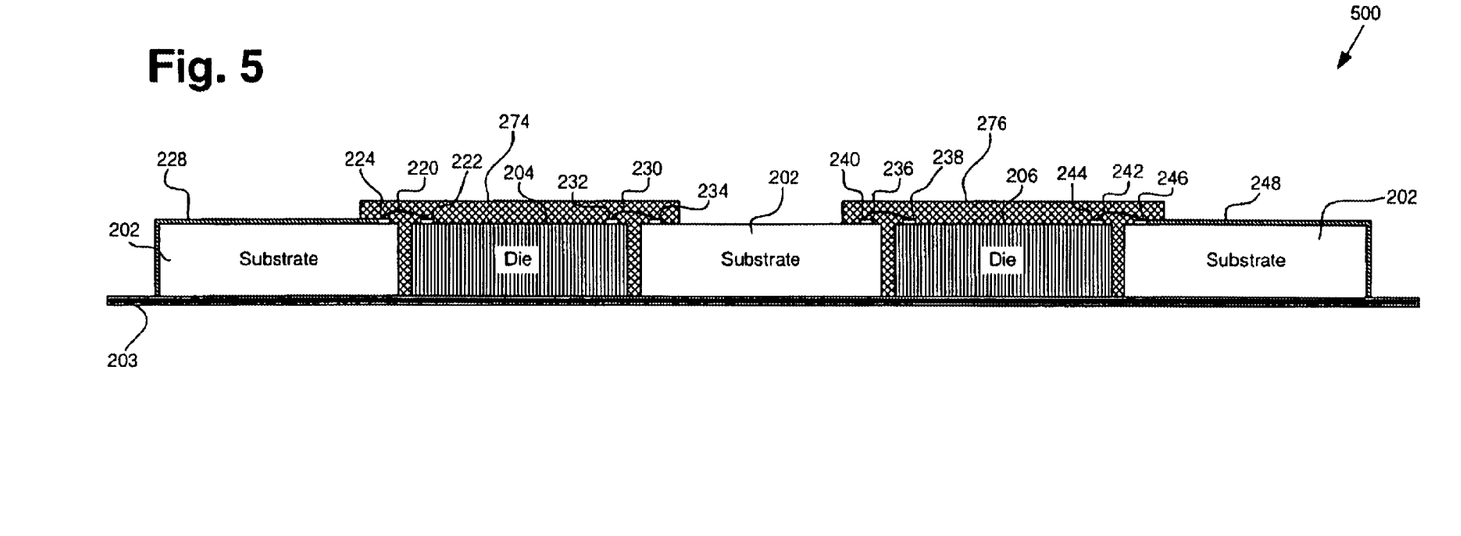
FIG. 5 illustrates epoxy securing the two semiconductor dies with the substrate in FIG. 4.

FIG. 5 shows the next step in the present embodiment of the invention. As shown in FIG. 5, epoxy 274 covers and seals semiconductor die 204, bonding wires 220 and 230, and substrate bond pads 224 and 234. Epoxy 274 also flows in the areas between the side walls of semiconductor die 204 and substrate 202. Similarly, epoxy 276 covers and seals semiconductor die 206, bonding wires 236 and 242, and substrate bond pads 240 and 246, and flows in the areas between the side walls of semiconductor die 206 and substrate 202. Therefore, epoxies 274 and 276, respectively, mechanically secure semiconductor dies 204 and 206 to substrate 202. Thus, as a result of the present embodiment's step shown in FIG. 5, epoxies 274 and 276 are added to structure 400 in FIG. 4.

Figure 6:
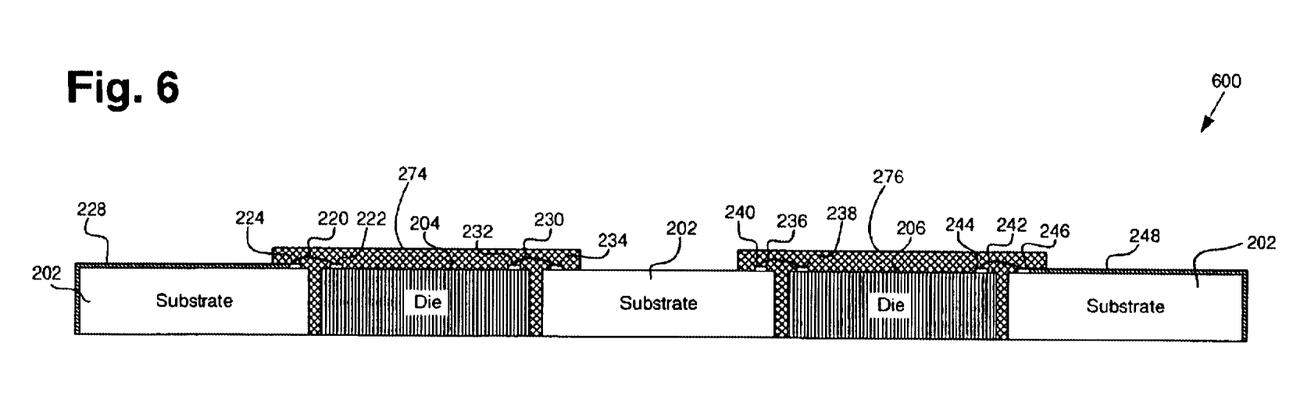
FIG. 6 illustrates the structure in FIG. 5 with tape removed from the bottom of the structure.

The next step in the present embodiment of the invention is shown in FIG. 6. FIG. 6 shows structure 600, which results from the removal of tape 203 from structure 500 in FIG. 5. As stated above, as a result of the invention's step shown in FIG. 5, semiconductor dies 204 and 206 are mechanically secured to substrate 202 by epoxies 274 and 276. Since epoxies 274 and 276 mechanically secure semiconductor dies 204 and 206 to substrate 202, structure 600 no longer requires tape 203 to hold semiconductor dies 204 and 206 and substrate 202 in alignment.

Figure 7:
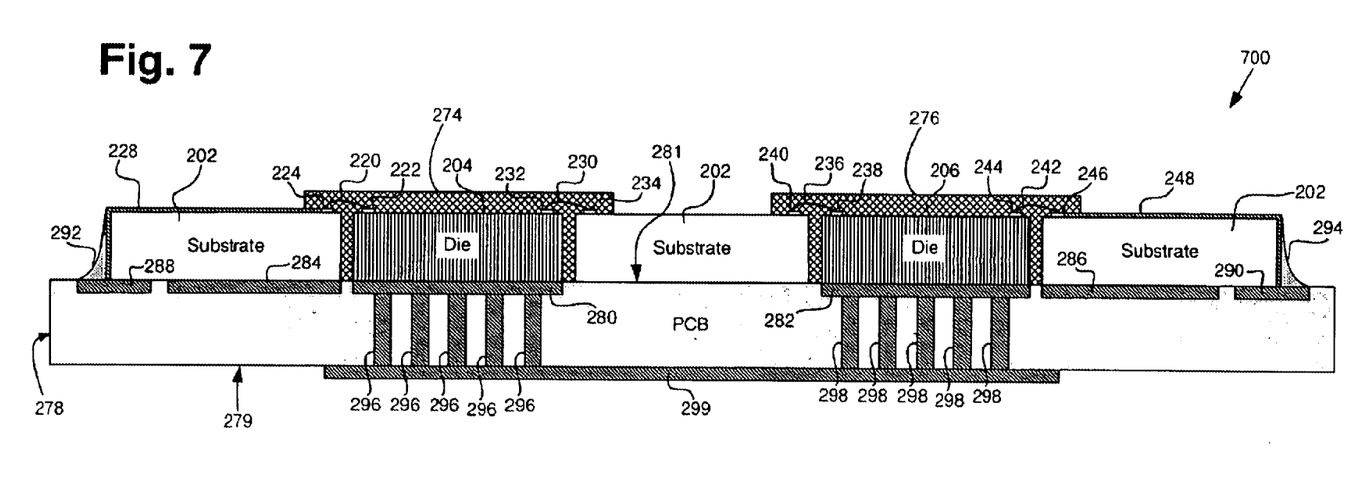
FIG. 7 illustrates the structure of FIG. 6 attached to a top surface of a printed circuit board according to one embodiment of the present invention.

FIG. 7 shows the last step according to the present embodiment of the invention. As shown in FIG. 7, structure 700 results from attaching structure 600 in FIG. 6 to PCB 278. PCB 278 can comprise multiple layers and can be fabricated by methods known in the art. PCB 278 includes support pads 280 and 282, respectively, which are situated directly underneath and are in contact with the bottom surfaces of semiconductor dies 204 and 206. Support pads 280 and 282 can comprise copper, copper alloys, solder-plated copper, or other thermally and electrically conductive metals, such as aluminum or gold. Solder paste or thermal grease can be applied to support pads 280 and 282, respectively, to decrease thermal resistance, and thus increase heat transfer from semiconductor dies 204 and 206.

PCB 278 also includes ground pads 284 and 286, which are situated on top surface 281 of PCB 278. Ground pads 284 and 286 are similar to support pads 280 and 282 discussed above, and comprise similar material as support pads 280 and 282. PCB 278 further includes interconnect pad 288, which is electrically connected to interconnect trace 228 by solder 292. Thus, interconnect pad 288 is electrically connected to semiconductor die 204 bond pad 222 by way of bonding wire 220, substrate bond pad 224, interconnect trace 228, and solder 292. Interconnect pad 288 can comprise copper, solder-plated copper, or other metals such as aluminum or gold.

PCB 278 also includes interconnect pad 290, which is electrically connected to interconnect trace 248 by solder 294. Thus, interconnect pad 290 is electrically connected to semiconductor die 206 bond pad 244 by way of bonding wire 242, substrate bond pad 246, interconnect trace 248, and solder 294. Interconnect pad 290 is similar to interconnect pad 288 and comprises similar material as interconnect pad 288. PCB 278 further includes vias 296 and vias 298, which are situated within PCB 278. Vias 296 and vias 298, respectively, extend from support pads 280 and 282 to ground plane 299 of PCB 278. In one embodiment, vias 296 and vias 298, respectively, can extend from top surface 281 of PCB 278 to ground plane 299 of PCB 278. In such instance, vias 296 and vias 298, respectively, would be in direct contact with the bottom surfaces of semiconductor dies 204 and 206. In another embodiment, vias 296 and vias 298, respectively, can be "blind" vias that extend from support pads 280 and 282 to a ground plane inside PCB 278. In yet another embodiment, vias 296 and vias 298 can be "blind" vias that extend from top surface 281 of PCB 278 to a ground plane inside PCB 278. Vias 296 and vias 298 can comprise a thermally conductive material, such as copper. In one embodiment, vias 296 and vias 298 can be filled with solder.

Ground plane 299 is situated on bottom surface 279 of PCB 278, and is in contact with vias 296 and vias 298. In one embodiment, ground plane 299 can be situated on top surface 281 of PCB 278. In another embodiment, ground plane 299 can be situated inside PCB 278. Ground plane 299 can comprise copper, solder-plated copper, or other thermally and electrically conductive metals, such as aluminum or gold.

The electrical and thermal characteristics of structure 700 in FIG. 7 will now be discussed. In structure 700, as discussed above, semiconductor dies 204 and 206, respectively, are inserted in cutout sections 212 and 214 (shown in FIG. 2) in substrate 202. As a result, semiconductor dies 204 and 206 are situated in close proximity to substrate 202 on top surface 281 of PCB 278. By situating semiconductor dies 204 and 206, respectively, in close proximity to substrate 202, structure 700 allows semiconductor die bond pads to be electrically connected to substrate bond pads by minimal length, low inductance and low resistance bonding wires. For example, minimal length, low inductance bonding wires 220 and 236, respectively, electrically connect semiconductor die 204 bond pad 222 and semiconductor die 206 bond pad 238 to substrate bond pads 224 and 240. Thus, as a result of the present invention, the bonding wires are significantly shorter than they are in a conventional package, resulting in reduced inductance and resistance and, therefore, facilitating high speed applications such as fiber optics applications.

In structure 700, semiconductor dies 204 and 206 and substrate 202 are situated on top surface 281 of PCB 278. By situating substrate 202 on top surface 281 of PCB 278, structure 700 allows traces on substrate 202, such as interconnect trace 248, to be electrically connected to pads on PCB 278, such as interconnect pad 290, by solder, such as solder 294. Thus, structure 700 provides the advantage of a small footprint by allowing substrate 202 to be electrically connected to PCB 278 without the use of protruding leads that increase the package size, as required in a conventional ETQFP package.

The semiconductor dies 204 and 206, respectively, are in direct contact with support pads 280 and 282, which provide ground connections for semiconductor dies 204 and 206. Support pads 280 and 282, respectively, are further connected to ground plane 299 by way of vias 296 and 298. Thus, support pads 280 and 282, vias 296 and 298, and ground plane 299 combine to provide a low resistance, low inductance ground for semiconductor dies 204 and 206, respectively.

It is necessary to thermally conduct excess heat away from a semiconductor die to prevent damage to the semiconductor die. As additional semiconductor dies are "housed" in a structure, the increased heat generated by the additional semiconductor dies requires a structure with very efficient heat dissipation to allow the semiconductor dies to "co-exist" in the same structure. In structure 700, semiconductor dies 204 and 206, respectively, are situated in direct contact with support pads 280 and 282 on top surface 281 of PCB 278. By situating semiconductor dies 204 and 206, respectively, in direct contact with support pads 280 and 282 on top surface 281 of PCB 278, structure 700 minimizes the thermal resistance, and thus maximizes the heat transfer path between semiconductor dies 204 and 206 and PCB 278. Thus, support pads 280 and 282, respectively, provide very effective heat sinks to conduct excessive heat away from semiconductor dies 204 and 206.

In structure 700, support pads 280 and 282, respectively, are connected to vias 296 and vias 298, which are further connected to ground plane 299. Support pads 280 and 282, vias 296 and vias 298, and ground plane 299 can comprise a thermally conductive metal such as copper. Additionally, vias 296 and vias 298 can be filled with solder, which is thermally conductive. Adding solder to vias 296 and vias 298 can also increase their cross-sectional area thus providing a larger cross-sectional area through which heat can be conducted. Also, the large surface area of support pads 280 and 282, respectively, provides a large conduit for the conduction of heat generated by semiconductor dies 204 and 206. Similarly, the large surface area of ground plane 299 provides a large conduit for the conduction of heat flowing through vias 296 and vias 298. Vias 296 and vias 298, respectively, also provide efficient and "multiple" thermal connections between support pads 280 and 282 and ground plane 299. Thus, by situating semiconductor dies 204 and 206, respectively, in direct contact with support pads 280 and 282 on top surface 281 of PCB 278 and by utilizing vias 296 and vias 298 and ground plane 299, structure 700 provides an effective mechanism to dissipate heat generated by semiconductor dies 204 and 206.

From the above description of the invention it is manifest that various techniques can be used for implementing the concepts of the present invention without departing from its scope. Moreover, while the invention has been described with specific reference to certain embodiments, a person of ordinary skill in the art would recognize that changes can be made in form and detail without departing from the spirit and the scope of the invention. The described embodiments are to be considered in all respects as illustrative and not restrictive. It should also be understood that the invention is not limited to the particular embodiments described herein, but is capable of many rearrangements, modifications, and substitutions without departing from the scope of the invention.

Thus, a leadless chip carrier for reduced thermal resistance has been described.

What is claimed is:

1. A structure comprising:
   a semiconductor die;
   a substrate having a cutout section, said semiconductor die being situated in said cutout section;
   a printed circuit board having a support pad on a top surface of said printed circuit board and at least one via situated in said printed circuit board, said at least one via being in thermal and electrical contact with said support pad;
   said substrate being attached to said printed circuit board such that said semiconductor die is secured to said support pad.

2. The structure of claim 1 wherein a semiconductor die bond pad on said semiconductor die is connected to a substrate bond pad on said substrate.

3. The structure of claim 1 wherein an interconnect trace on said substrate is connected to an interconnect pad on said top surface of said printed circuit board.

4. The structure of claim 1 wherein said substrate comprises a ceramic material.

5. The structure of claim 1 wherein said substrate comprises a fiber glass based laminate material.

6. The structure of claim 1 wherein said semiconductor die is attached to said substrate by epoxy.

7. A structure comprising:
   a plurality of semiconductor dies;
   a substrate having a plurality of cutout sections, each of said plurality of semiconductor dies being situated in a respective one of said plurality of cutout sections;
   a printed circuit board having a plurality of support pads on a top surface of said printed circuit board and at least one via situated in said printed circuit board, said at least one via being in thermal and electrical contact with at least one of said plurality of support pads;
   said substrate being situated on said printed circuit board and each of said plurality of semiconductor dies being situated on a respective one of said plurality of support pads.

8. The structure of claim 7 wherein a respective semiconductor die bond pad on a respective one of said plurality of semiconductor dies is connected to a substrate bond pad on said substrate.

9. The structure of claim 7 wherein an interconnect trace on said substrate is connected to an interconnect pad on said top surface of said printed circuit board.

10. The structure of claim 7 wherein said substrate comprises a ceramic material.

11. The structure of claim 7 wherein said substrate comprises a fiber glass based laminate material.

12. The structure of claim 7 wherein said plurality of semiconductor dies are attached to said substrate by epoxy.

13. A method for fabricating a structure for receiving a semiconductor die, said method comprising steps of:

forming a first cutout section in a substrate;

inserting a first semiconductor die in said first cutout section;

securing said first semiconductor die to said substrate;

placing said substrate on a top surface of a printed circuit board, said top surface of said printed circuit board having a support pad, said printed circuit board having at least one via situated in said printed circuit board, said at least one via being in thermal and electrical contact with said support pad, said first semiconductor die being situated on said support pad.

14. The method of claim 13 further comprising a step of forming a second cutout section in said substrate after said step of forming said first cutout section.

15. The method of claim 14 further comprising a step of inserting a second semiconductor die in said second cutout section.

16. The method of claim 13 further comprising a step of connecting a semiconductor die bond pad on said first semiconductor die to a substrate bond pad on said substrate.

17. The method of claim 13 further comprising a step of connecting an interconnect trace on said substrate to an interconnect pad on said top surface of said printed circuit board.

18. The method of claim 13 wherein said substrate comprises a ceramic material.

19. The method of claim 13 wherein said substrate comprises a fiber glass based laminate material.

20. The method of claim 16 wherein said connecting step comprises using a bonding wire to connect said semiconductor die bond pad on said first semiconductor die to said substrate bond pad on said substrate.

21. A structure comprising:

a plurality of semiconductor dies;

a substrate having a plurality of cutout sections, each of said plurality of semiconductor dies being situated in a respective one of said plurality of cutout sections;

a printed circuit board having a plurality of support pads on a top surface of said printed circuit board;

said substrate being situated on said printed circuit board and each of said plurality of semiconductor dies being situated on a respective one of said plurality of support pads;

wherein a respective semiconductor die bond pad on a respective one of said plurality of semiconductor dies is connected to a substrate bond pad on said substrate.

22. The structure of claim 21 wherein an interconnect trace on said substrate is connected to an interconnect pad on said top surface of said printed circuit board.

23. The structure of claim 21 wherein said substrate comprises a ceramic material.

24. The structure of claim 21 wherein said substrate comprises a fiber glass based laminate material.

25. The structure of claim 21 wherein said plurality of semiconductor dies are attached to said substrate by epoxy.

26. A method for fabricating a structure for receiving a semiconductor die, said method comprising steps of:

forming a first cutout section in a substrate, said substrate comprising a fiber glass based laminate material;

inserting a first semiconductor die in said first cutout section;

securing said first semiconductor die to said substrate;

placing said substrate on a top surface of a printed circuit board, said top surface of said printed circuit board having a support pad, said first semiconductor die being situated on said support pad.

27. A method for fabricating a structure for receiving a semiconductor die, said method comprising steps of:

forming a first cutout section in a substrate;

inserting a first semiconductor die in said first cutout section;

securing said first semiconductor die to said substrate;

placing said substrate on a top surface of a printed circuit board, said top surface of said printed circuit board having a support pad, said first semiconductor die being situated on said support pad;

connecting a semiconductor die bond pad on said first semiconductor die to a substrate bond pad on said substrate by using a bonding wire.

* * * * *

UNITED STATES PATENT AND TRADEMARK OFFICE
CERTIFICATE OF CORRECTION

PATENT NO. : 6,787,895 B1
DATED : September 7, 2004
INVENTOR(S) : Jarcy et al.

It is certified that error appears in the above-identified patent and that said Letters Patent is hereby corrected as shown below:

Title page,
Item [75], Inventors, replace "Evans S. McCarthy" with -- Evan S. McCarthy --, replace "Robbie U. Villanueva, Il Via Bandada, CA (US)" with -- Robbie U. Villanueva, Rancho Santa Margarita, CA (US) --.

Signed and Sealed this

Seventeenth Day of May, 2005

JON W. DUDAS
*Director of the United States Patent and Trademark Office*